United States Patent [19]

Yamaguchi et al.

[11] Patent Number: 5,231,038

[45] Date of Patent: Jul. 27, 1993

[54] METHOD OF PRODUCING FIELD EFFECT TRANSISTOR

[75] Inventors: Takehisa Yamaguchi; Masahiro Shimizu, both of Hyogo, Japan

[73] Assignee: Mitsubishi Denki Kabushiki Kaisha, Tokyo, Japan

[21] Appl. No.: 888,707

[22] Filed: May 27, 1992

Related U.S. Application Data

[60] Division of Ser. No. 703,717, May 22, 1991, Pat. No. 5,144,393, which is a continuation of Ser. No. 461,583, Jan. 5, 1990, abandoned.

[30] Foreign Application Priority Data

Apr. 4, 1989 [JP] Japan .................................. 1-86011

[51] Int. Cl.⁵ .......................................... H01L 21/265
[52] U.S. Cl. .......................................... 437/40; 437/41; 437/44; 437/45; 437/200
[58] Field of Search ................ 437/40, 41, 44, 45, 437/200

[56] References Cited

U.S. PATENT DOCUMENTS

| | | | |
|---|---|---|---|
| 4,845,046 | 7/1989 | Shimko | 437/44 |
| 4,855,247 | 8/1989 | Ma et al. | 437/200 |
| 4,877,755 | 10/1989 | Rodder | 437/200 |
| 4,889,827 | 12/1989 | Willer | 437/44 |
| 4,939,154 | 7/1990 | Shimbo | 437/44 |
| 4,978,629 | 12/1990 | Komori et al. | 437/40 |
| 4,992,388 | 2/1991 | Pfiester | 437/40 |
| 5,008,209 | 4/1991 | Appels et al. | 437/44 |
| 5,082,794 | 1/1992 | Pfiester | 437/44 |

*Primary Examiner*—Brian E. Hearn
*Assistant Examiner*—Kevin M. Picardat
*Attorney, Agent, or Firm*—Lowe, Price, LeBlanc & Becker

[57] ABSTRACT

A field effect transistor including a gate electrode, a source electrode and a drain electrode which are formed on a major surface of a silicon substrate. An impurity contained in the source electrode and the drain electrode is diffused into the silicon substrate by heat treatment of thereby form source and drain areas of the transistor. The source electrode and the drain electrode are electrically insulated from the gate electrode by a side-wall insulating film. The side-wall insulating film and the gate insulating film are formed by separate steps, so can each be formed in optimum thickness.

31 Claims, 14 Drawing Sheets

GATE BREAKDOWN VOLTAGE

METHOD OF PRODUCING FIELD EFFECT TRANSISTOR

This application is a division of application Ser. No. 07/703,717 filed May 22, 1991, now U.S. Pat. No. 5,144,393 is a continuation of application Ser. No. 07/461,583, filed Jan. 5, 1990, now abandoned.

BACKGROUND OF THE INVENTION

1. Field of the Invention

The present invention relates to a method of producing a field effect transistor which is provided with a gate electrode, a source electrode and a drain electrode on a major surface of a semiconductor substrate and wherein an impurity contained in the source and drain electrodes is diffused by heat treatment into the semiconductor substrate to form a source area and a drain area. Particularly, the present invention is connected with a method of producing a side-wall insulating film for electrically insulating the source and drain electrodes from the gate electrode.

2. Description of the Background Art

FIG. 6 is a sectional view showing the structure of a MOS (Metal Oxide Semiconductor) field effect transistor which is a kind of a field effect transistor.

A thin gate film 2 is formed on the surface of a silicon substrate 1, and a gate electrode 3 is formed by a polycrystalline silicon on the gate oxide film 2. Further, a source area 4 and a drain area 5 are formed in the surface of the silicon substrate 1 on both sides of the gate electrode 3. The source and drain areas 4, 5 are formed by ion implantation into the silicon substrate 1 using the gate electrode 3 as a mask, followed by heat treatment. On the surface of the silicon substrate 1 there is formed a field oxide film 6 to separate semiconductor devices from each other. On the surface of the silicon substrate 1 and that of the gate electrode 3 there is formed an interlayer insulating film 7, on which are formed wiring layers 8a and 8b using aluminum. The source area 4 and the wiring layer 8a are connected together electrically by aluminum filled in a contact hole 9a formed in the interlayer insulating film 7, while the drain area 5 and the wiring layer 8b are electrically connected together by aluminum filled in a contact hole 9b formed in the interlayer insulating film 7.

Now, in a conventional MOS field effect transistor, the source region 4 and the drain region 5 are formed by directly implanting ions to the silicon substrate and thereafter by thermally diffusing the implanted ions. Consequently, crystal defects 4a and 5a are generated in the silicon substrate 1. The crystal defects degrade electric characteristics of the MOS field effect transistor. The crystal defects are generated in the region where the impurities stay. Namely, the crystal defects 4a and 5a are generated at lower portions of the source and drain regions 4 and 5.

FIG. 10A is a graph showing the relation between the current and the voltage in a device having no crystal defect at the pn junction. FIG. 10B is a graph showing the relation between the current and the voltage in a device having crystal defects at the pn junction. It can be seen that the pn junction breakdown voltage of the device having crystal defects at the pn junction (FIG. 10B) is considerably lower than that of the device having no crystal defect at the pn junction (FIG. 10A). Recently, moreover, there has been an increasing demand for miniaturization, speed-up and reduction or power consumption of MOS field effect transistors.

As a transistor free of such crystal defect caused by ion implantation near the surface of the silicon substrate and satisfying the demand for miniaturization, etc. of a MOS field effect transistor, there is a polysilicon source-drain transistor (hereinafter referred to as "PSD transistor").

FIG. 7 is a sectional view showing the structure of the PSD transistor. On the surface of a silicon substrate 11 is formed a thin gate oxide film 12a, on which is formed a gate electrode 13 by a polycrystalline silicon. The gate electrode 13 is T-shaped in section. A source area 14 and a drain area 15 are formed near the surface of the silicon substrate 11. Further, a field oxide film 16 is formed on the surface of the silicon substrate 11, and an electric conductor layer 17a is formed by a polycrystalline silicon on both the source area 14 and the field oxide film 16, while an electric conductor 17b is formed by a polycrystalline silicon on both the drain area 15 and the field oxide film 16. Between the gate electrode 13 and the conductor layer 17a there is formed a side-wall insulating film 12b, while between the gate electrode 13 and the conductor layer 17b there is formed a side-wall insulating film 12c. The gate electrode 13 and the conductor layers 17a, 17b are electrically insulated from each other by the side-wall insulating films 12b and 12c. An interlayer insulating film 18 is formed on the conductor layers 17a, 17b and also on the gate electrode 13. And on the interlayer insulating film 18 there are formed wiring layers 19a and 19b by aluminum. The wiring layer 19a and the conductor layer 17a are electrically connected together by aluminum filled in a contact hole 20a formed in the interlayer insulating film 18, while the wiring layer 19b and the conductor layer 17b are electrically connected together by aluminum filled in a contact hole 20b formed in the interlayer insulating film 18.

How to produce the PSD transistor will be described below with reference to FIGS. 8A to 8H.

First, the field oxide film 16 for device separation is formed in a predetermined area on the surface of the silicon substrate 11 according to LOCOS (Local Oxidation of Silicon) method. Next, a first polycrystalline silicon film 17 is formed by deposition on the surface of the silicon substrate 11 according to a CVD (Chemical Vapor Deposition) method. Further, an impurity is ion-implanted in the first polycrystalline silicon film 17 (FIG. 8A).

A silicon oxide film 18 is formed by deposition on the first polycrystalline silicon film 17 according to the CVD method (FIG. 8B).

The portion of the first polycrystalline silicon film 17 and that of the silicon oxide film 18 corresponding to the gate electrode-forming portion of the PSD transistor are removed by reactive ion etching (FIG. 8C).

Thereafter the silicon substrate 11 is thermally oxidized (FIG. 8D). By the thermal diffusion of the silicon substrate 11, a gate oxide film 12a and side-wall insulating films 12b and 12c are simultaneously formed on the surface of the silicon substrate at the gate electrode forming portion and on the surfaces of the first polycrystalline silicon film 17 on both sides thereof. By this thermal diffusion, moreover, the impurity which has been implanted into the first polycrystalline silicon film 17 is diffused into the silicon substrate 11, whereby there are formed source and drain areas 14, 15 (FIG. 8E).

A second polycrystalline silicon film 23 is formed by deposition on the silicon oxide film 18 and also on the gate oxide film 12a according to the CVD method (FIG. 8F).

The second polycrystalline silicon film 23 and the silicon oxide film 18 are removed selectively by etching to form a gate electrode 13 (FIG. 8G).

On the first polycrystalline silicon film 17 and the gate electrode 13 there is formed a silicon oxide film 18 by deposition according to the CVD method. The silicon oxide film 18 on the first polycrystalline silicon film 17 is partially removed by etching to form a contact hole 20. Then, an aluminum wiring layer 19 is formed on the silicon oxide film 18 by vacuum deposition. The aluminum wiring layer 19 and the first polycrystalline silicon film 17 are electrically connected together by aluminum filled in the contact hole 20 (FIG. 8H). The PSD transistor manufacturing process is completed by the above steps.

Features of the PSD transistor will be described below in comparison with the conventional MOS field effect transistor with reference to FIGS. 6 and 7.

(1) In the conventional MOS field effect transistor, the source and drain areas 4, 5 are formed by ion implantation directly into the silicon substrate 1 followed by thermal diffusion. Consequently, crystal defects 4a and 5a were generated in the source and drain regions 4 and 5 by the ion implantation.

Meanwhile, in the PSD transistor, ions for forming the source and drain regions 14 and 15 are implanted into the first polycrystalline silicon films 17a and 17b. The implanted ions remain in the first polycrystalline silicon films 17a and 17b. Thereafter, the implanted ions are thermally diffused to form the source and drain regions 14 and 15. Consequently, generation of crystal defects by the ion implantation is suppressed in the source and drain regions 14 and 15.

(2) In the conventional MOS field effect transistor, a contact hole 9a is formed above the source area 4 and it is filled with aluminum to thereby make electrical connection between the wiring layer 8a and the source area 4, while a contact hole 9b is formed above the drain area 5 and it is filled with aluminum to thereby make electrical connection between the wiring layer 8b and the drain area 5. Since the source and drain areas 4, 5 have been reduced in size with the demand for miniaturization of the MOS field effect transistor, it is becoming difficult to positively locate the contact holes 9a and 9b above the source and drain areas 4, 5 respectively, resulting in frequent occurrence of poor electrical connection between the source, drain areas 4, 5 and the wiring layer 8a, 8b.

On the other hand, in the PSD transistor, a contact hole 20a is formed above the first polycrystalline silicon film 17a extending from the surface of the source area 14 to the surface of the field oxide film 16 and it is filled with aluminum to thereby make electrical connection between the source area 14 and the wiring layer 19a, while a contact hole 20b is formed above the first polycrystalline silicon film 17b extending from the surface of the drain area 15 to the surface of the field oxide film 16 and it is filled with aluminum to thereby make electrical connection between the drain area 15 and the wiring layer 19b. Therefore, even if the source and drain areas 14, 15 are reduced in size, it is possible to positively effect electrical connection between the source, drain areas 14, 15 and the wiring layers 19a, 19b if only the area of the first polycrystalline silicon films 17a, 17b is sufficiently large.

(3) The miniaturization of the MOS field effect transistor can be attained also by making more shallow the source and drain areas.

In the conventional MOS field effect transistor, the source and drain areas 4, 5 are formed by direct ion implantation into the major surface of the semiconductor substrate 1 followed by thermal diffusion. On the other hand, in the PSD transistor, the source and drain areas 14, 15 are formed by ion implantation into the first polycrystalline silicon films 17a, 17b followed by thermal diffusion. In the PSD transistor, the source and drain regions can be made shallower than in the conventional MOS field effect transistors, since the starting point of diffusing ions is different. In addition, since no crystal defect is generated in the source and drain regions of the PSD transistor, it is not necessary to repair the crystal defects. Consequently, the time required for thermal diffusion can be made shorter, which leads to the formation of shallower source and drain regions.

(4) The demand for miniaturization of the MOS field effect transistor also leads to shortening of the channel length. In the conventional MOS field effect transistor, the channel length, indicated at 10, and the width of the gate electrode 3 are the same, so there has been the problem that the shorter the channel length 10, the smaller the sectional area of the gate electrode 3, resulting in increased electrical resistance of the gate electrode 3. On the other hand, in the PSD transistor, since the width of the upper portion of the gate electrode 13 is larger than the channel length indicated at 21, it is possible to enlarge the sectional area of the upper portion of the gate electrode 13 even when the channel length 21 is made small, whereby the gate resistance can be made low.

With these features, the PSD transistor can be attained its miniaturization, speed-up and low power consumption as compared with the conventional MOS field effect transistor.

However, the PSD transistor involves two drawbacks, which will be explained below.

In the conventional PSD transistor, as shown in FIG. 8E, the gate oxide film 12a and the side-wall insulating film 12b, 12c are formed at the same time by thermal oxidation. The thermal oxidation is performed so that the gate oxide film 12a has an optimum thickness. The side-wall insulating film s 12b and 12c formed by the said thermal oxidation may be destroyed by a certain difference between the voltage applied to the gate electrode 13 and that applied to the polycrystalline silicon film s 17a, 17b, resultant in electrical connection between the gate electrode 13 and the polycrystalline silicon films 17a, 17b.

Now, polycrystalline silicon doped with impurities is more susceptible to oxidation than polycrystalline silicon which is not doped. It has been experimentally known that n type impurities facilitates oxidation more than the p type impurities. Therefore, if the impurity to be implanted into the polycrystalline silicon films 17a and 17b is made n-type, the above-mentioned drawback can be remedied to some extent because the side-wall insulating films 12b and 12c become thicker than the gate oxide film 12a. A transistor where in the side-wall insulating films 12b and 12c are made thicker than the gate oxide film 12a by implantation of an n-type impurity into the polycrystalline silicon films 17a and 17b is disclosed in IEEE ELECTRON DEVICE LETTERS, VOL. EDL-7, NO. 5, May 1986, pp. 314-316 "A MOS Transistor with Self-Aligned Polysilicon Source-Drain".

However, the following problems are involved in the first drawback of the PSD transistor.

According to the conventional method wherein the side-wall insulating film 12b and 12c are made thicker than the gate oxide film 12a by the implantation of an n-type impurity into the polycrystalline silicon films 17a and 17b, the gate oxide film 12a and the side-wall insulating films 12a, 12c are formed at the same time by thermal oxidation. The thermal oxidation is performed so that the gate oxide film 12a has an optimum thickness. The gate oxide film 12a must be made thin in order to operate the MOS transistor with low power consumption. Since the gate oxide film 12a and the side-wall insulating films 12b and 12c are simultaneously formed in the prior art method, the side-wall insulating films 12b and 12c are inevitably made thinner when the gate oxide film 12a is made thinner. In this method, therefore, the reduction in thickness of the gate oxide film 12a causes the likelihood of dielectric breakdown of the side-wall insulating films 12b and 12c.

When p type impurities (for example, boron) are implanted into the polycrystalline silicon films 17a and 17b, the thickness of the gate oxide film 12a will be approximately the same as that of the side-wall insulating films 12b and 12c, in accordance with the conventional method of simultaneously forming the gate oxide film 12a and the side-wall insulating films 12b and 12c. In pMOS and complementary MOS transistors, therefore, it has heretofore been difficult to form the side-wall insulating films 12b and 12c to the extend of not causing dielectric breakdown.

The other drawback of the PSD transistor will be explained below.

The PSD transistor employs the polycrystalline silicon film s 17a and 17b respectively as an electric conductor layer for electrical connection between the source area 14 and the aluminum wiring layer 19a and an electric conductor layer for electrical connection between the drain area 15 and the aluminum wiring layer 19b. Since the polycrystalline silicon is high in resistance, it exerts a bad influence on the speed-up and reduction in power consumption of the PSD transistor.

However, the problem that the polycrystalline silicon is high in resistance can be overcome by forming a highly electroconductive metal silicide layer on the polycrystalline silicon film s 17a and 17b. FIG. 9 is a sectional view of a PSD transistor with a metal silicide layer formed on a polycrystalline silicon film. Numeral 39 indicates the metal silicide layer. In FIG. 9, numeral 31 denotes a silicon substrate, 32 a gate oxide film, 33 a polycrystalline silicon film, 34 a source area, 35 a drain area, 36 a field oxide film, 37 a polycrystalline silicon film and 38 a silicon oxide film.

The method of producing such PSD transistor is described, for example, in Japanese Patent Laying-Open No. 118651/1980.

A PSD transistor in which, although the gate oxide film and the side-wall insulating films are simultaneously formed, the side-wall insulating films are made thicker than the gate oxide film by implanting n type impurities in the polycrystalline silicon film, and in which a metal silicide layer is formed on the polycrystalline silicon film is disclosed in U.S. patent application Ser. No. 272,994 filed on Nov. 17, 1988 by the same applicant of the present invention on Apr. 1, 1988.

SUMMARY OF THE INVENTION

The present invention has been accomplished for overcoming such conventional problems and it is an object of the invention to provide a method of producing a field effect transistor capable of attaining both the requirement for thinning the gate oxide film and the request for thickening the side-wall insulating film to the extent of not causing dielectric breakdown thereof.

It is another object of the present invention to provide a field effect transistor capable of easily adjusting the thickness of a side-wall insulating film.

It is further object of the present invention to provide a field effect transistor capable of satisfying the aforesaid two requests and also capable of decreasing the resistance of an electric conductor layer for electrode.

A still further object of the present invention is to provide a method of manufacturing a field effect transistor in which the thickness of the side-wall insulating films can be freely changed regardless of the types (p type, n type) of the impurities implanted.

A still further object of the present invention is to provide a field effect transistor having a thin gate oxide film and thick side-wall insulating films.

The present invention relates to a method of producing a field effect transistor which is provided with gate, source and drain electrodes on a major surface of a semiconductor substrate and wherein source and drain areas are formed by diffusing an impurity contained in the source and drain electrodes into the semiconductor substrate by heat treatment.

The method of manufacturing the field effect transistor in accordance with the present invention comprises the following steps.

A first conductive layer which will be the source and drain electrodes is formed on a main surface of a semiconductor substrate.

A first insulating film is formed on the first conductive layer.

The first insulating film and the first conductive layer are selectively removed by etching, so that a main surface of the semiconductor substrate which is positioned at a channel forming region of a field effect transistor is exposed.

A second insulating film is formed on the main surface of the exposed semiconductor substrate and on the first insulating film.

The second insulating film is etched to leave side-wall insulating films on the side surfaces of the first conductive layer and on the side surfaces of the first insulating film.

A gate insulating film is formed on a main surface of a semiconductor substrate positioned on the channel forming region.

A second conductive layer is formed on the gate insulating film, the side-wall insulating films and on the second insulating film.

A gate electrode having a prescribed shape is formed by patterning the second conductive layer.

In the field effect transistor producing method of the present invention, the side-wall insulating film and the gate insulating film are formed by separate steps. Therefore, it is possible to form both films in respective optimum thickness.

In another aspect of the present invention, the field effect transistor producing method according to the present invention includes, in addition to the above steps, further steps of depositing, after the formation of the gate electrode, a metallic film on both the gate electrode surface and the first electric conductor layer to serve as the source and drain electrodes and then heat-treating the metallic film to form a silicide layer on both the gate electrode surface and the first electric conductor layer.

Thus, in the field effect transistor producing method of the present invention, there is formed the silicide layer on all of the surfaces of the gate, source and drain electrodes, these electrodes can be reduced in resistance as compared with the formation of the first electric conductor layer alone.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of a PSD transistor producing method according to the present invention will be described below with reference to FIGS. 1A to 1L.

Figure 1A:
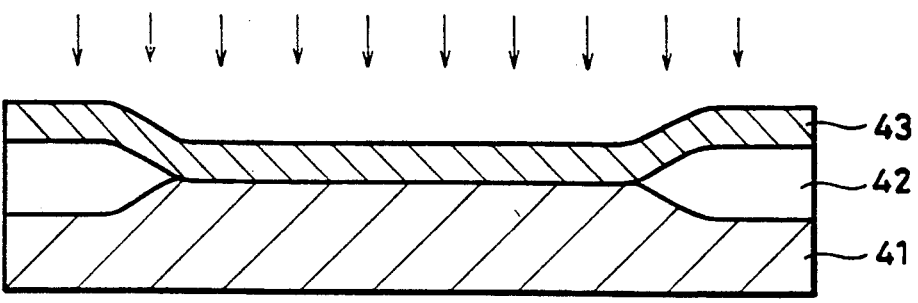
FIGS. 1A to 1L are sectional views successively showing steps of a field effect transistor producing method according to an embodiment of the present invention.

First, a field oxide film 42 for device separation is formed at a predetermined area on the surface of a silicon substrate 41 according to the LOCOS method. Then, a first polycrystalline silicon film 43 is formed by deposition on the surface of the silicon substrate 41 according to the CVD method. Thereafter, p+ ions are implanted to the first polycrystalline silicon film 43 with the accelerating energy being 30 KeV and the dosage being $1.0 \times 10^{14}$ ions/cm$^2$. Then, As+ ions are implanted to the first polycrystalline silicon film 43 with the accelerating energy being 50 KeV and the dosage being $4.0 \times 10^{15}$ ions/cm$^2$(FIG. 1A).

Figure 1B:
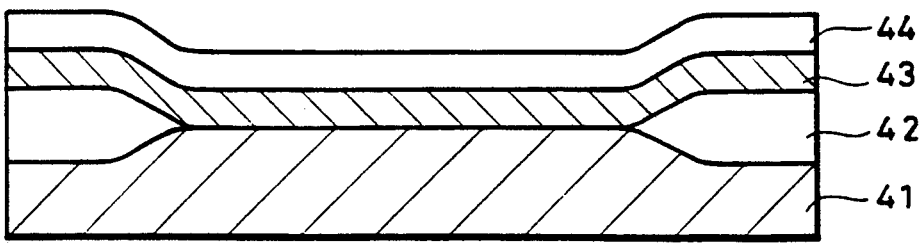

A first silicon oxide film 44 is formed by deposition on the first polycrystalline silicon film 43 according to the CVD method (FIG. 1B).

Figure 1C:
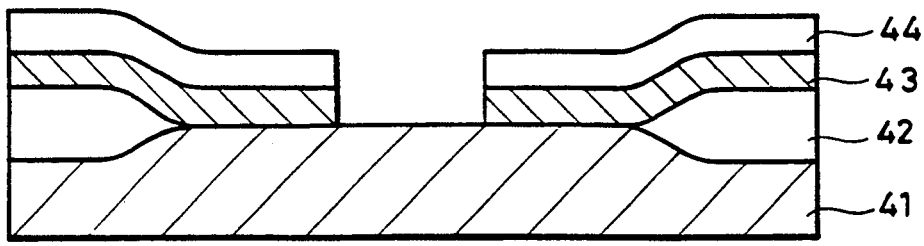

The portion of the first polycrystalline silicon film 43 and that of the first silicon oxide film 44 located in the position corresponding to the gate electrode-forming portion are removed selectively by reactive ion etching (FIG. 1C).

Figure 1D:
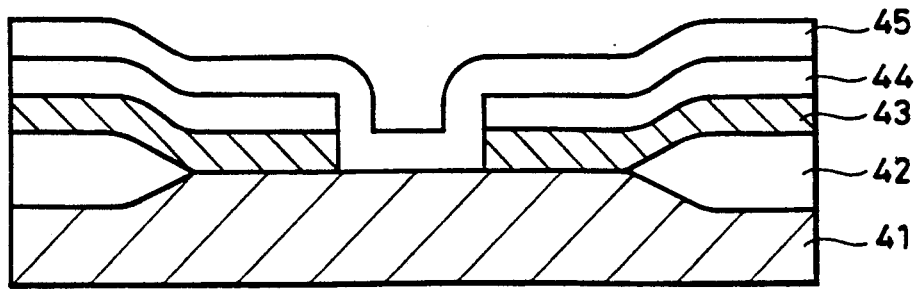

A second silicon oxide film 45 is formed by deposition on the first silicon oxide film 44 and also on the portion of the silicon substrate 41 located in the position corresponding to the gate electrode-forming portion according to the CVD method (FIG. 1D).

Figure 1E:
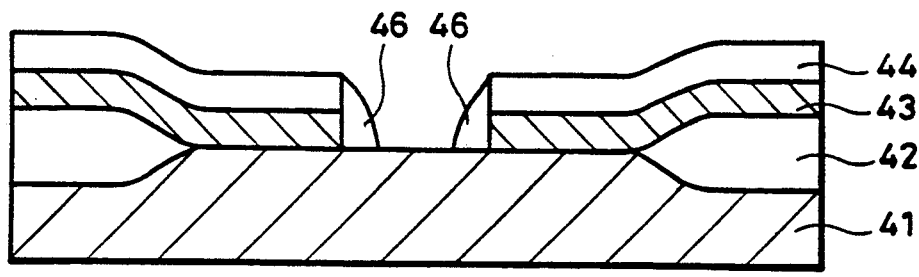

The second silicon oxide film 45 is subjected to reactive ion etching so that there remain the second silicon oxide film 45 positioned on the side faces of the first polycrystalline silicon film 43 and of the first silicon oxide film 44, to form side-wall insulating films 46. The side-wall insulating film 46 is formed to have an arc (FIG. 1E).

Reactive ion etching is one type of dry etching. The seeds of reaction are radicals and active ions. The mechanism of reaction is a composition of chemical reaction caused by radicals and physical reaction caused by active ions. Etching can be carried out anisotoropically by the reactive ions etching, thereby enabling minute processing of the device. For this reason, the reactive ion etching is often employed in the process of manufacturing semiconductors.

As described above, the reactive ions etching utilizes physical reaction of ion impact. Therefore, the ions impinge metal parts in a reaction furnace and the metal falls on a main surface of the silicon substrate 14. Therefore, the main surface of the silicon substrate 41 is cleared by sacrificial oxidation described in the following.

Figure 1F:
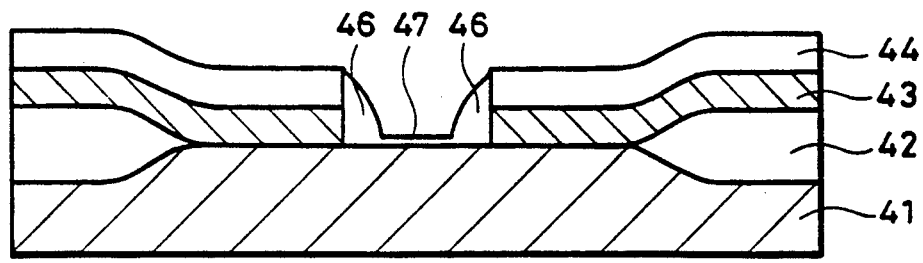

First, a sacrificial oxide film 47 is formed by thermal oxidation of the main surface of the silicon substrate 41. Consequently, a damaged layer near the main surface of the silicon substrate 41 is absorbed in the sacrificial oxide film (FIG. 1F).

Figure 1G:
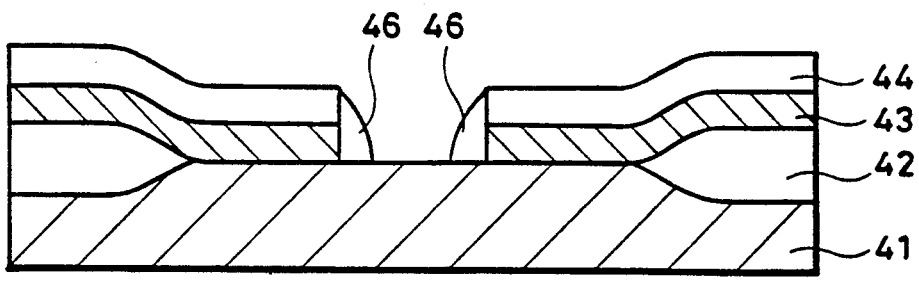

The sacrificial oxide film 47 is removed by hydrofluoric acid solution (FIG. 1G).

The sacrificial oxide film 47 is removed by wet etching using the hydrofluoric acid solution, since the sacrificial oxide film 47 can be removed without damaging the main surface of the silicon substrate 41 by such solution. Thus, the main surface of the silicon substrate 41 is cleared.

Figure 1H:
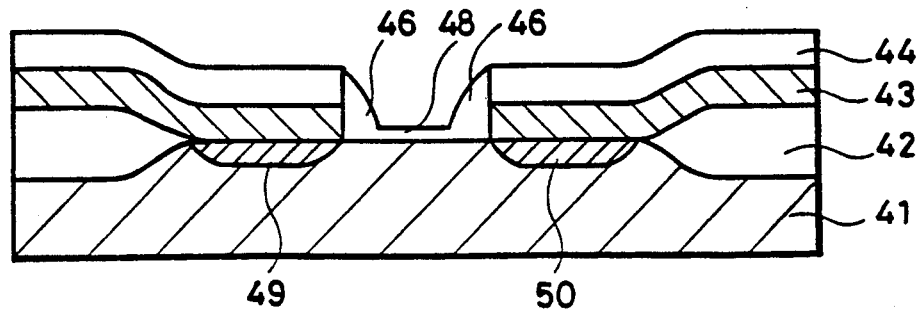

The surface portion of the silicon substrate 41 corresponding to the gate electrode forming portion is heat-treated to form a gate oxide film 48 having an optimum thickness. By this heat treatment the impurity which has been implanted into the first polycrystalline silicon film 43 is diffused into the silicon substrate 41, whereby there are formed a source area 49 and a drain area 50 (FIG. 1H).

Figure 1I:
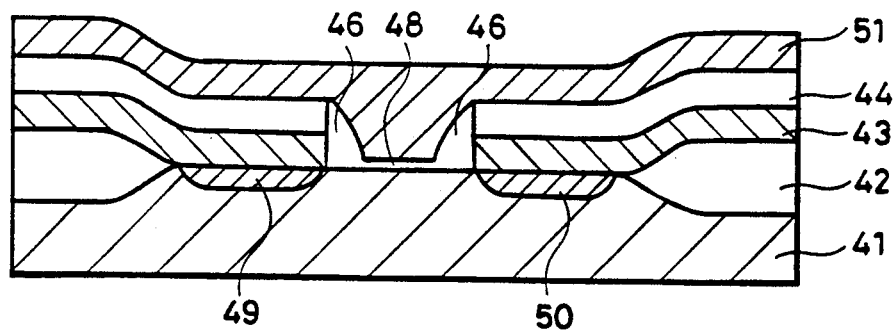

A second polycrystalline silicon film 51 is formed by deposition on both the first silicon oxide film 44 and the gate oxide film 48 according to the CVD method (FIG. 1I).

Figure 1J:
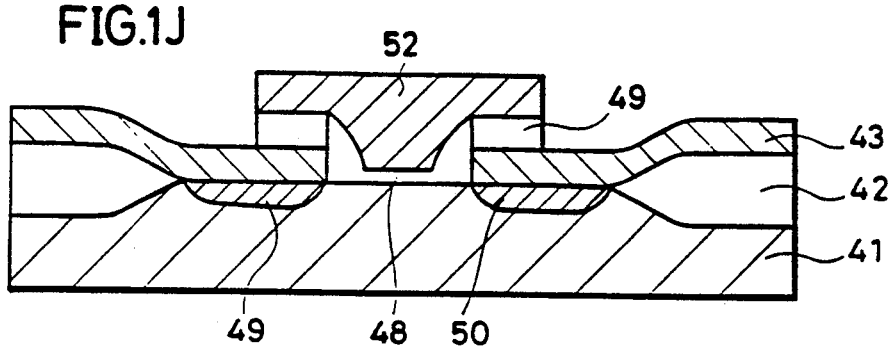

A gate electrode 52 is formed by selectively etching of the first silicon oxide film 44 and the second polycrystalline silicon film 51 (FIG. 1J).

Figure 1K:
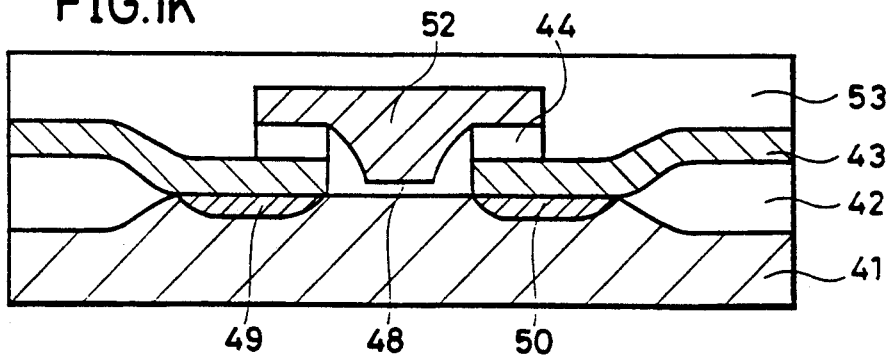

A third silicon oxide film 53 is formed on both the first polycrystalline silicon film 43 and the gate electrode 52 according to the CVD method (FIG. 1K).

The third silicon oxide film 53 on the first polycrystalline silicon film 43 is removed selectively by etching to form a contact hole 54. Then, an aluminum wiring layer 55 is formed on the third silicon oxide film by vacuum deposition. The aluminum wiring layer 55 and the first polycrystalline silicon film 43 are electrically connected together by aluminum filled in the contact hole 54. The PSD transistor producing process is completed by the above steps.

In this embodiment, since the gate insulating film and the side-wall insulating film are formed in separate steps, they can be formed each in optimum thickness.

It is desirable to form the side-wall insulating film so that the portion thereof corresponding to the shortest distance from a corner portion of the first polycrystalline silicon film up to the gate electrode becomes thicker twice of more that of the gate oxide film. This is for the following reason.

Figure 2:
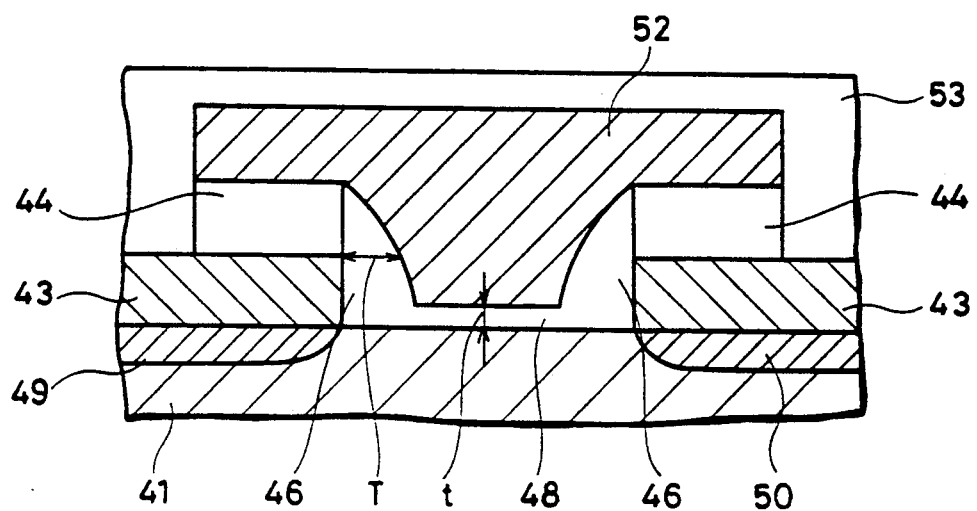
FIG. 2 is an enlarged sectional view of a gate portion of a MOS field effect transistor produced by the said method.

FIG. 2 is an enlarged sectional view showing the vicinity of a gate electrode of a PSD transistor produced according to the present invention. Now, the thickness of that portion of the side-wall insulating film 46 is represented by the letter T at which portion the distance between the gate electrode 52 and the corner portion of the first polycrystalline silicon film 43 is the shortest. The thickness T of that portion is used as the reference of the thickness of the side-wall insulating film 46, since the side-wall insulating film is most likely to be damaged at this portion, as the electric field concentrates at the edge portion of the polycrystalline silicon film. The thickness of the gate oxide film 48 is represented by the letter t.

Figure 3A:
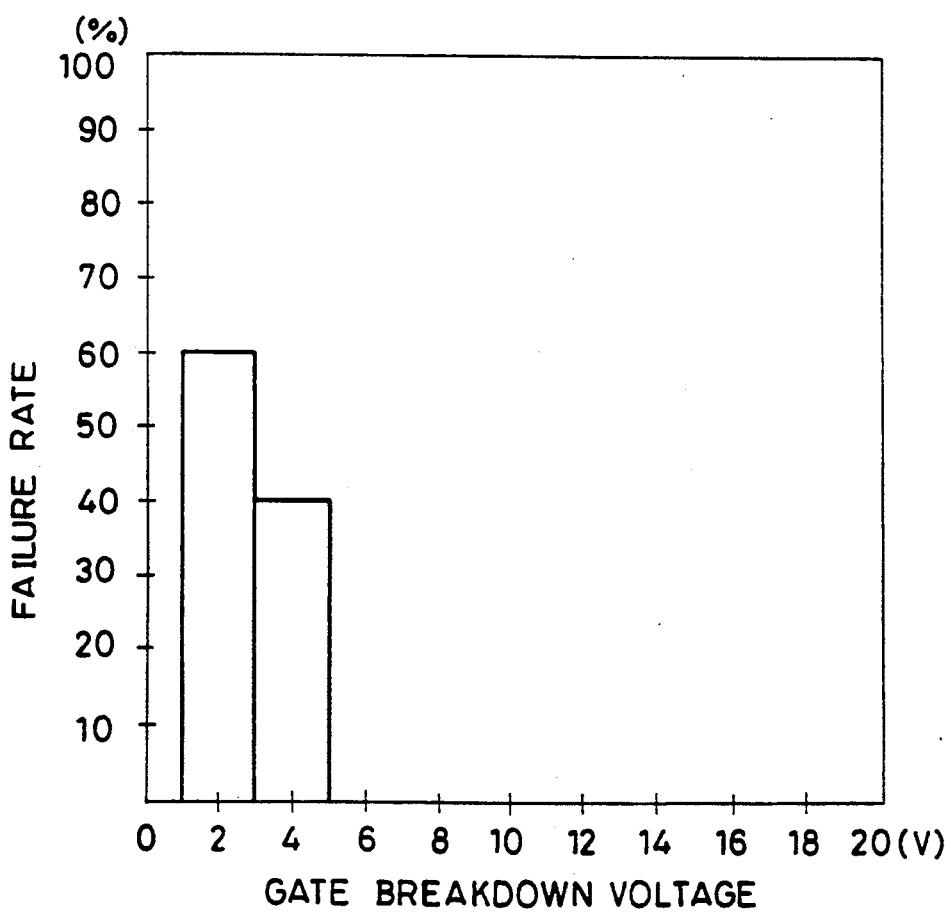
FIGS. 3A and 3B are graphs each showing the relation between gate withstand voltage and side-wall insulating film with respect to breakage.
Figure 3B:
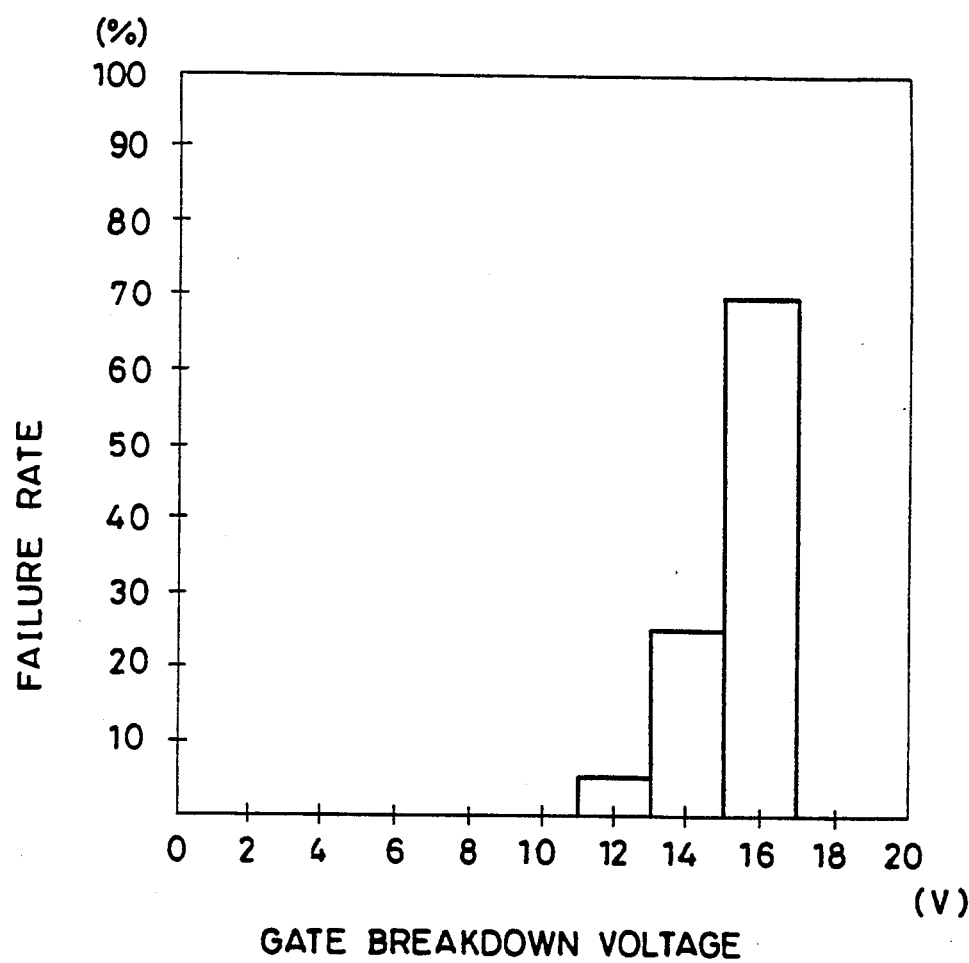

FIG. 3A is a graph showing what percentage of PSD transistors are destroyed in their side-wall insulating films 46 at certain voltages applied to the respective gate electrodes 52 out of plural PSD transistors each having a gate oxide film 48 thickness t of 150 Å and a side-wall insulating film 46 thickness T of 300 Å. FIG. 3B is a similar graph wherein the thickness t of the gate oxide film 48 and the T of the side-wall insulating film 46 are set at 150 Å and 500 Å, respectively.

As shown in FIG. 3A, in the PSD transistors wherein the thickness T of the side-wall insulating film is set at a value twice the thickness t of the gate oxide film, the side-wall insulating films of the PSD transistors corresponding to 60% of all the PSD transistors are destroyed when the gate voltage is set at 2 V, and the side-wall insulating films of the remaining 40% PSD transistors are destroyed at the gate voltage of 4 V.

On the other hand, as shown in FIG. 3B, in the PSD transistors wherein the side-wall insulating film thickness T is set at a value about three times the gate oxide film thickness t, the side-wall insulating films of the PSD transistors corresponding to 5% of all the PSD transistors are destroyed when the gate voltage is set at 12 V; the side-wall insulating films of the PSD transistors corresponding to 25% of all the PSD transistors are destroyed at a gate voltage of 14 V; and the side-wall insulating films of the PSD transistors corresponding to 70% of all of the PSD transistors are destroyed at a gate voltage of 16 V.

Thus, it is seen that the gate withstand voltage is remarkably improved by setting the side-wall insulating film thickness T at a value larger than twice the gate oxide film thickness t. According to the conventional method wherein the side-wall insulating film and the silicon oxide film are formed at a time by the implantation of an n-type impurity into the polycrystalline silicon film, the side-wall insulating film thickness can be set to a value twice the gate oxide film thickness, but a larger thickness thereof is impossible. On the other hand, in the present invention, since the side-wall insulating film and the gate oxide film are formed by separate steps, the side-wall insulating film thickness T can be set at a value larger than twice the gate oxide film thickness t. More particularly, if the mount of the second silicon oxide film 45 deposited on the first silicon oxide film 44 and the exposed major surface portion of the silicon substrate 41 is made larger, the second silicon oxide film 45 deposited on each side face of the first polycrystalline silicon film 43 become so much thicker, so it is possible to thicken the side-wall insulating film 46. When the bias voltage of the field effect transistor is 5 V, the thickness T should preferably in the range of 300 Å to 2500 Å. When the bias voltage of the field effect transistor is 3.3 V, the thickness T should preferably be in the range of 200 Å to 2000 Å.

Although in this embodiment the first polycrystalline silicon film 43 is used for electrical connection between the aluminum wiring layer 55 and the source, drain areas 49, 50, there may be used amorphous silicon. The use of amorphous silicon brings the following advantage. The direction of crystal grain boundary changes in the polycrystalline silicon dependent on the manner of deposition. When ions implanted in the polycrystalline silicon film are to be diffused in the silicon substrate, diffusion of ions is facilitated in some directions of the grain boundary. In such case, the source and drain regions cannot be made shallow. On the contrary, the crystal structure of the amorphous silicon is irregular, so that the diffusion of ions does not depend on the manner of deposition.

Although in this embodiment the ion implantation is performed after deposition of the first polycrystalline silicon film 43 on the silicon substrate 41, there may be done ion implantation into the first polycrystalline silicon film 43 after formation of the gate electrode 52 as shown in FIG. 1J. Or the ion implantation may be omitted by depositing an impurity-doped polycrystalline silicon film in place of the first polycrystalline silicon film 43.

Further, although in this embodiment the present invention is applied to a MOS field effect transistor, the present invention is not limited thereto, but is applicable also to other field effect transistors.

Another embodiment of a PSD transistor producing method according to the present invention will be described below with reference FIGS. 4A to 4E.

The steps up to the formation of the gate electrode 52 are the same as in the steps of FIGS. 1A to 1J in the previous embodiment, so will not be explained here.

Figure 4A:
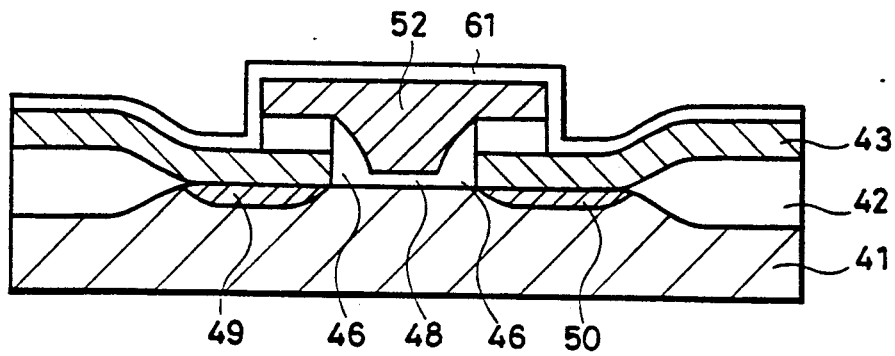
FIGS. 4A to 4E are sectional views successively showing steps of a field effect transistor producing method according to another embodiment of the present invention.

After formation of the gate electrode 52, a metallic film, e.g. titanium film 61 is deposited by sputtering on the first polycrystalline silicon film 43 (FIG. 4A).

Figure 4B:
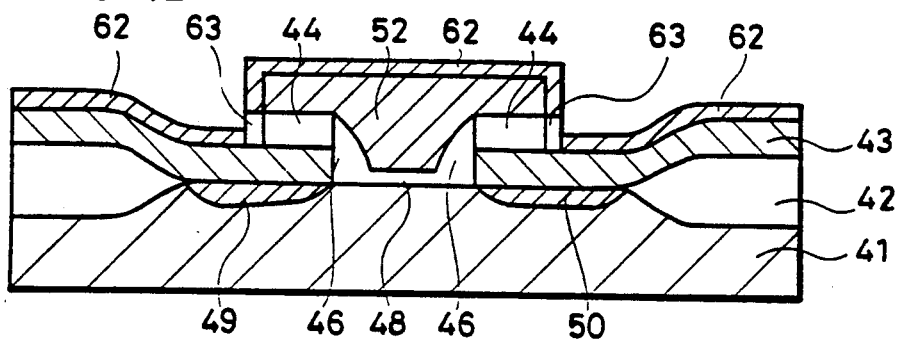

Then, the titanium film is subjected to lamp annealing at 70° C. in a nitrogen atmosphere. As a result, a titanium silicide film 62 is formed by the reaction of titanium and polycrystalline silicon on the surface of the gate electrode 52 formed by polycrystalline silicon and also on the surface of the first polycrystalline silicon film 43. On the other hand, on the surface of the first silicon oxide film 44 there is formed a titanium nitride 63 by the reaction of titanium and nitrogen in the nitrogen atmosphere. In this stage, however, the whole of the titanium film 61 is not reacted (FIG. 4B).

Figure 4C:
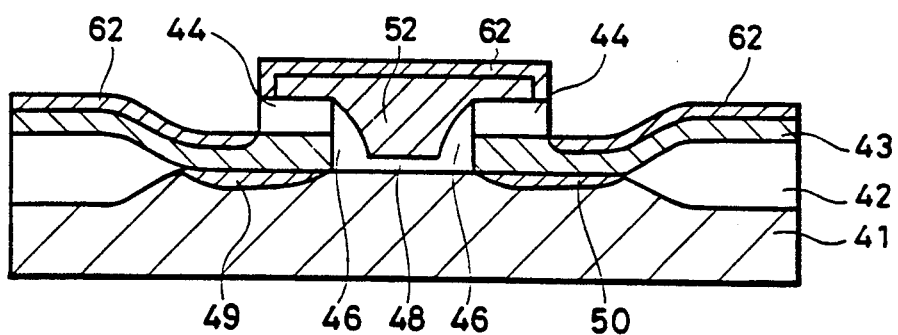

Then, unreacted titanium film 61 and titanium nitride film 63 are removed using an acid solution, followed by lamp annealing again at 800° C. in a nitrogen atmosphere to stabilize the titanium silicide film 62 (FIG. 4C). The reason why lamp annealing is performed in two stages is that if the whole of the titanium film 161 is reacted with the first polycrystalline silicon film 43, the titanium silicide 62 formed by the reaction of the first polycrystalline silicon film 43 and the titanium film 61 will grow along the side faces of the gate electrode 52, resulting in the possibility of conduction between the first polycrystalline silicon film 43 and the gate electrode 52.

Figure 1L:
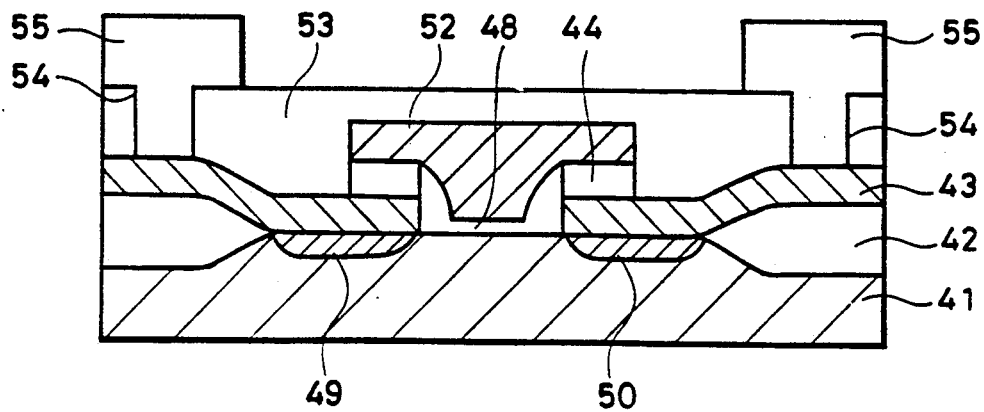
Figure 4D:
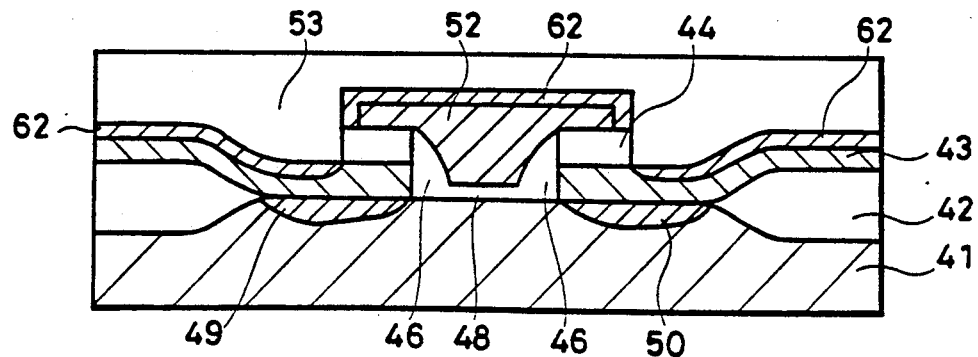
Figure 4E:
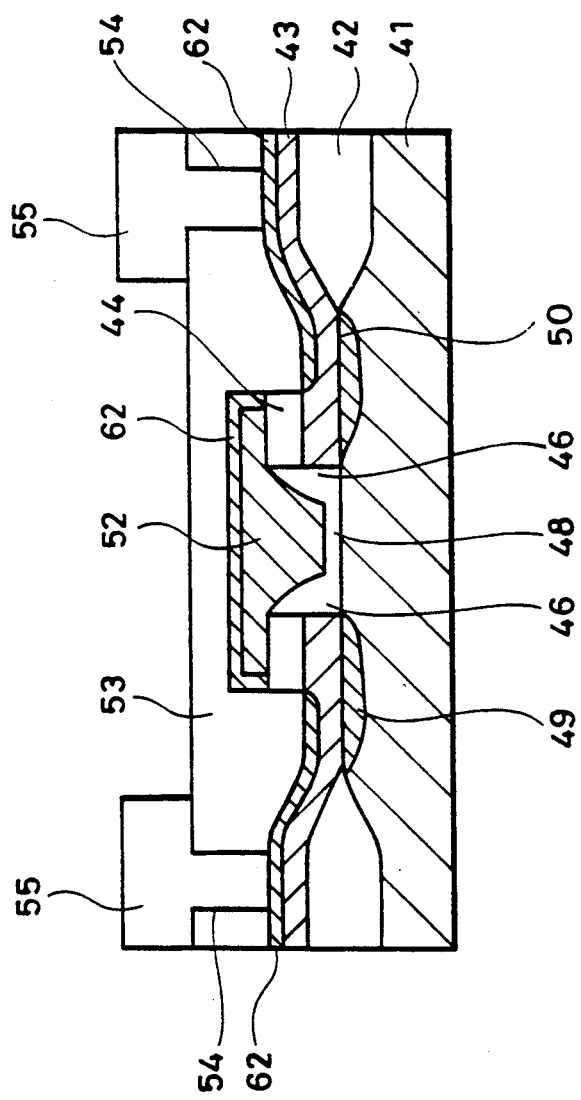

The steps from FIG. 4D to FIG. 4E are the same as the steps of FIG. 1K to FIG. 1L in the previous embodiment, so will not be explained here.

The PSD transistor manufacturing process according to this embodiment of the present invention is completed by the above steps.

An effect peculiar to this embodiment is that since the first polycrystalline silicon film 43 with the titanium silicide 62 formed on the surface thereof is used as an electric conductor layer, it is possible to reduce the resistance of the same layer as compared with the use of the first polycrystalline silicon film 43 alone as an electric conductor layer.

Although titanium is used as a metallic film in this embodiment, this does not constitute any limitation. There may be used tungsten, molybdenum, cobalt, nickel, platinum, tantalum, zirconium, or palladium.

Although in this embodiment the metallic film is deposited by sputtering, it may be formed by deposition using the CVD method.

A further embodiment of a PSD transistor producing method according to the present invention will be described below with reference to FIGS. 5A to 5G.

The step up to the formation of the gate electrode 52 are the same as the steps of FIGS. 1A to 1J in the previous embodiment, so will not be explained here.

Figure 5A:
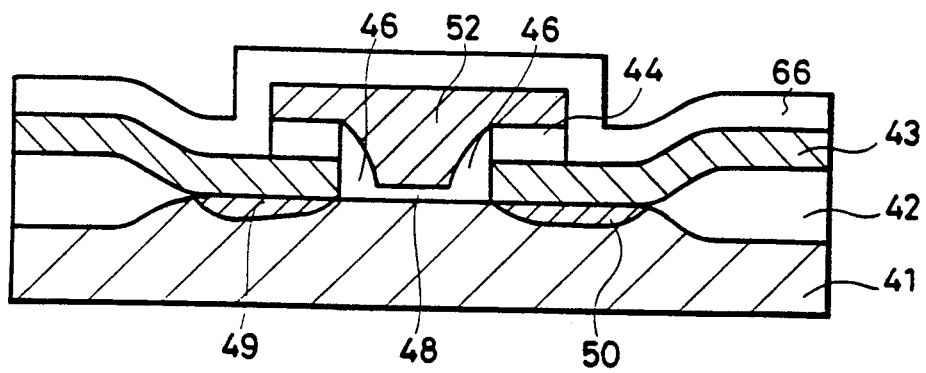
FIGS. 5A to 5G are sectional views successively showing steps of a field effect transistor producing method according to a further embodiment of the present invention.

After formation of the gate electrode 52, a fourth silicon oxide film 66 is formed by deposition on both the gate electrode 52 and the first polycrystalline silicon film 43 according to the CVD method (FIG. 5A).

Figure 5B:
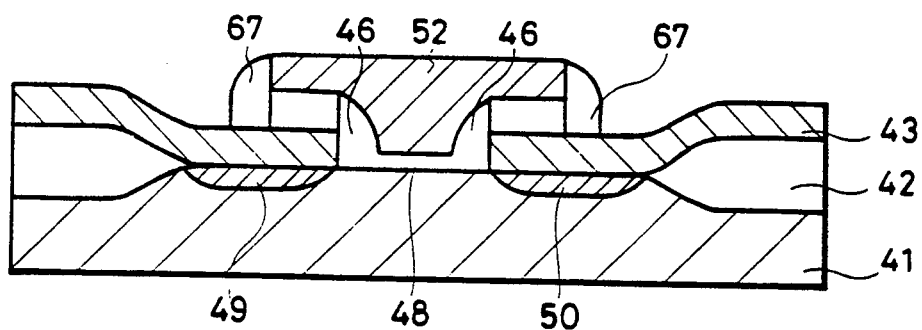
Figure 5C:
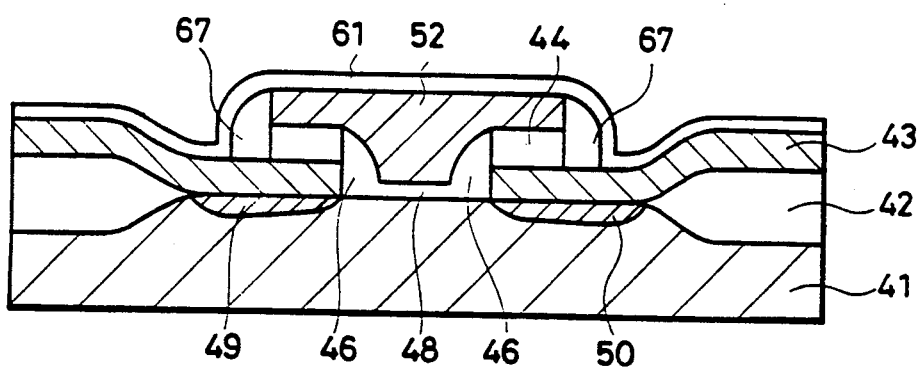
Figure 5D:
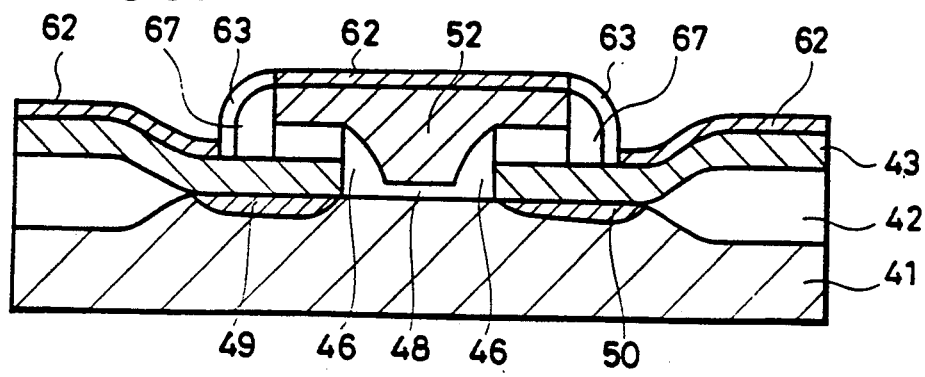
Figure 5E:
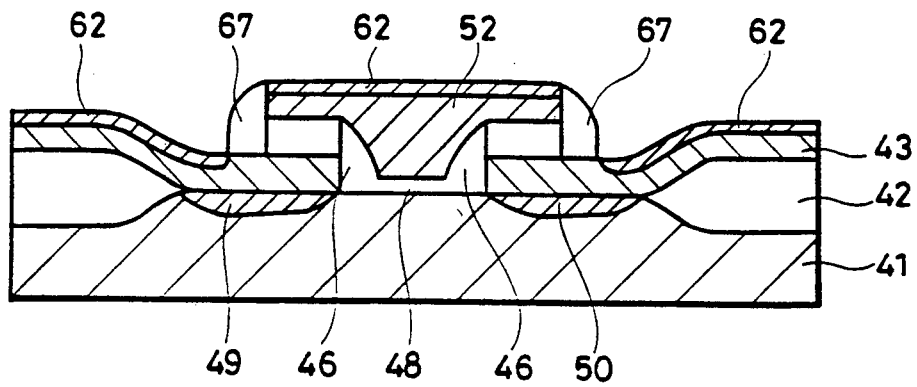
Figure 5F:
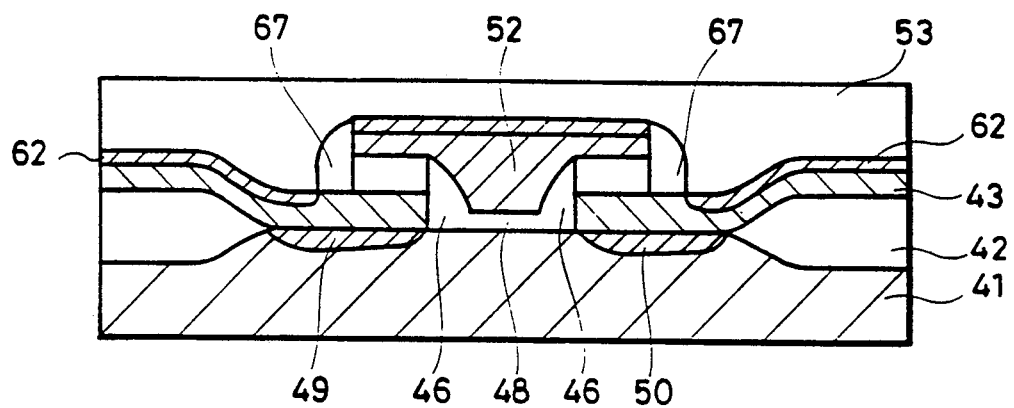
Figure 5G:
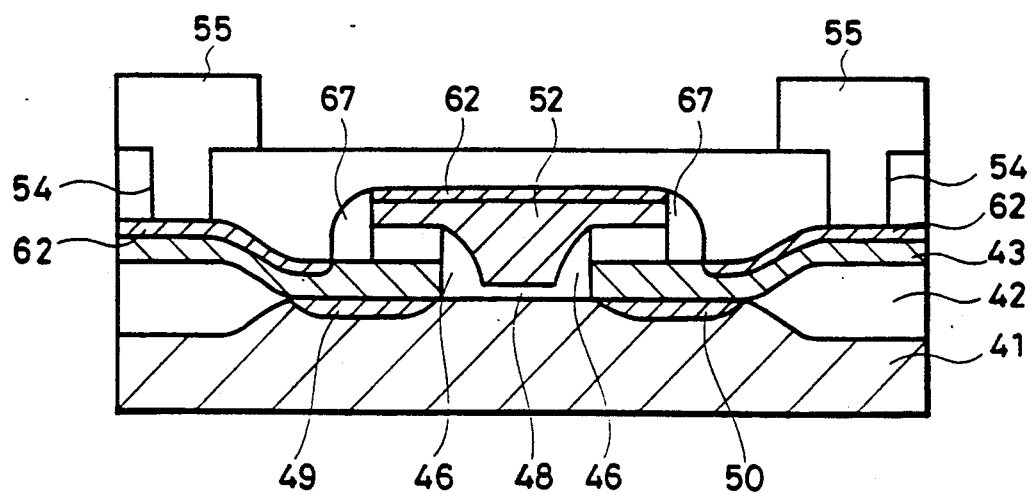
Figure 6:
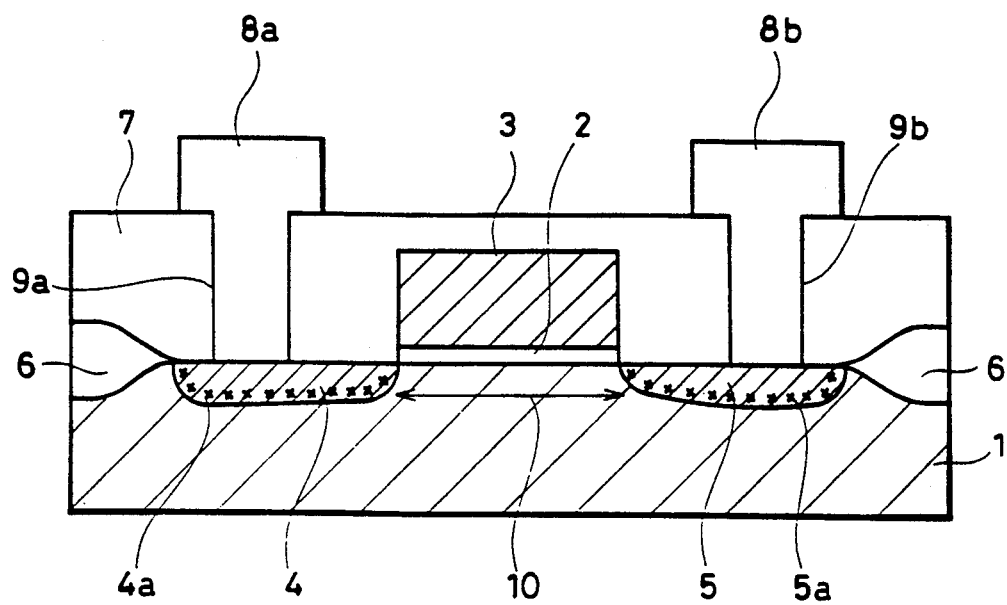
FIG. 6 is a sectional view of a conventional MOS field effect transistor.
Figure 7:
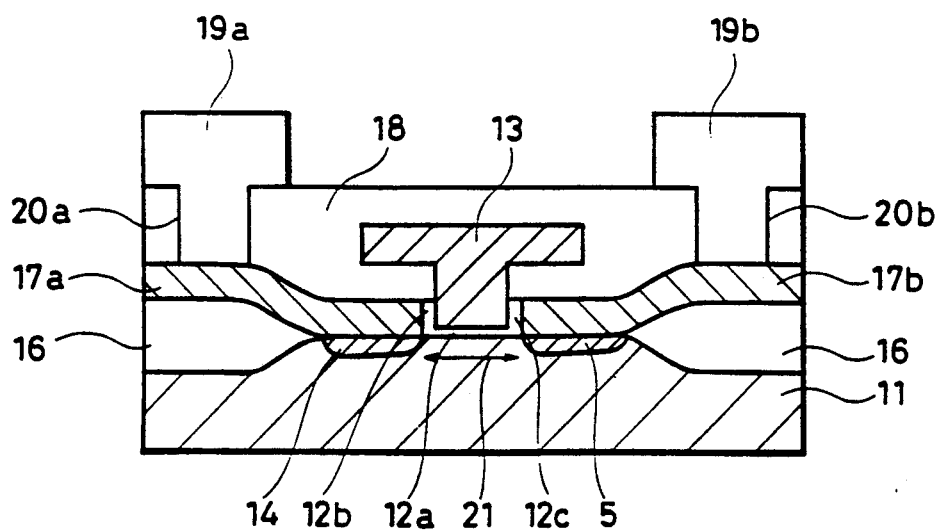
FIG. 7 is a sectional view of a PSD field effect transistor.
Figure 8A:
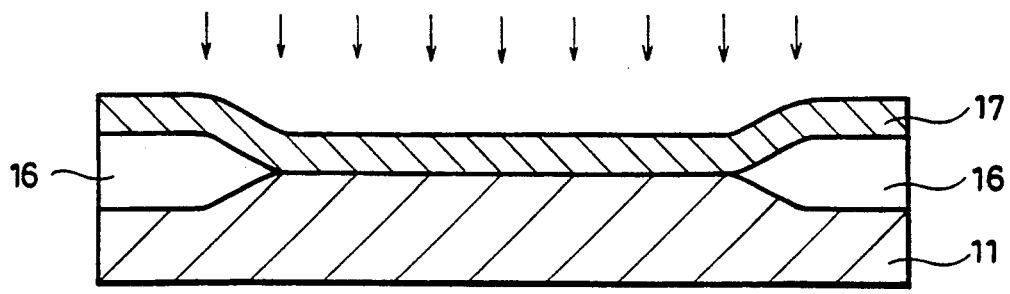
FIGS. 8A to 8H are sectional views successively showing conventional PSD field effect transistor producing steps.
Figure 8B:
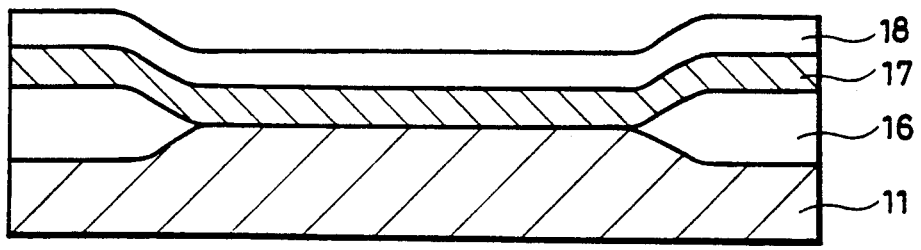
Figure 8C:
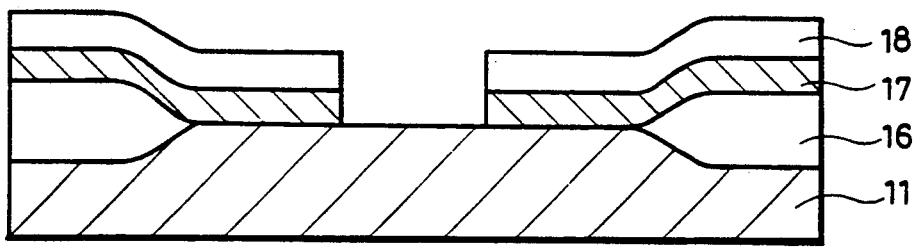
Figure 8D:
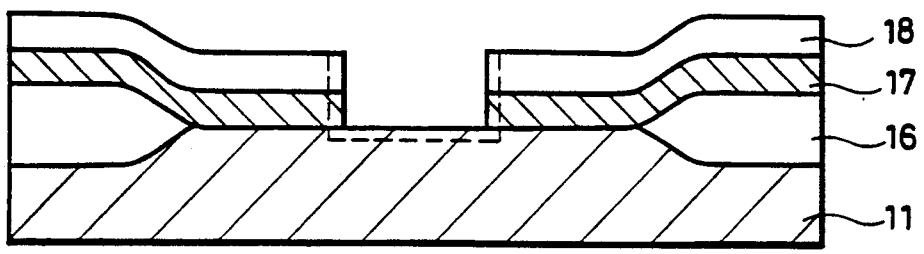
Figure 8E:
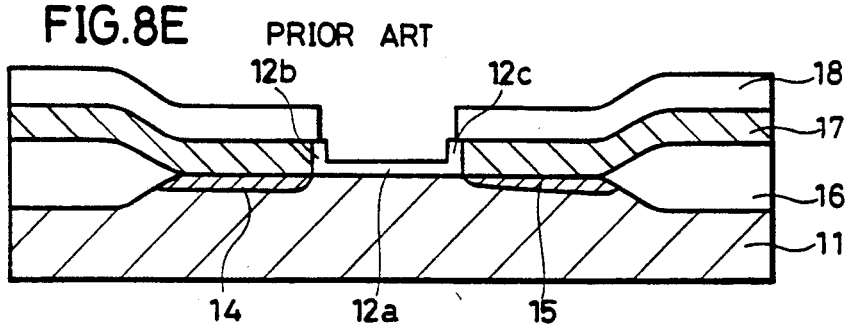
Figure 8F:
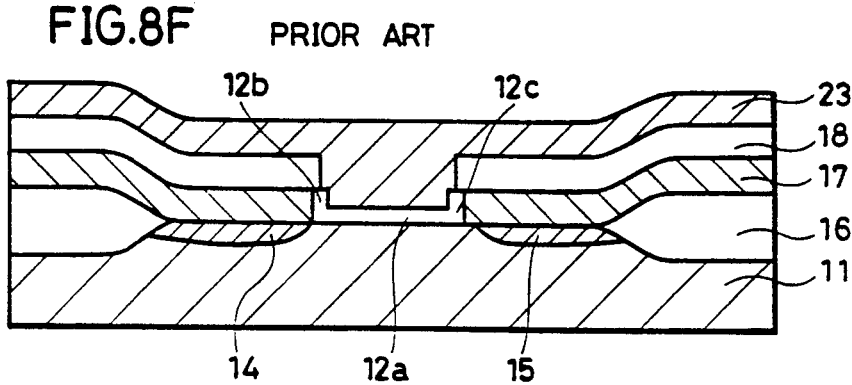
Figure 8G:
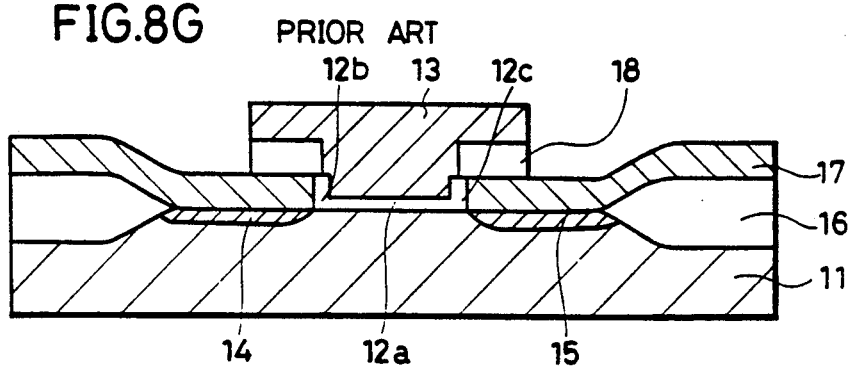
Figure 8H:
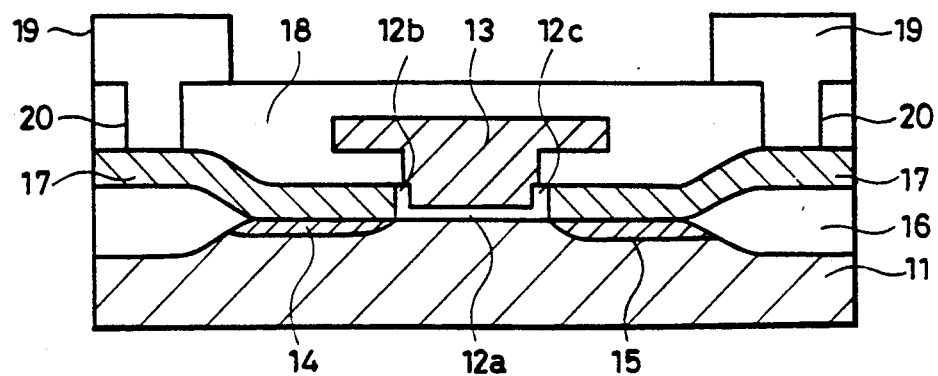
Figure 9:
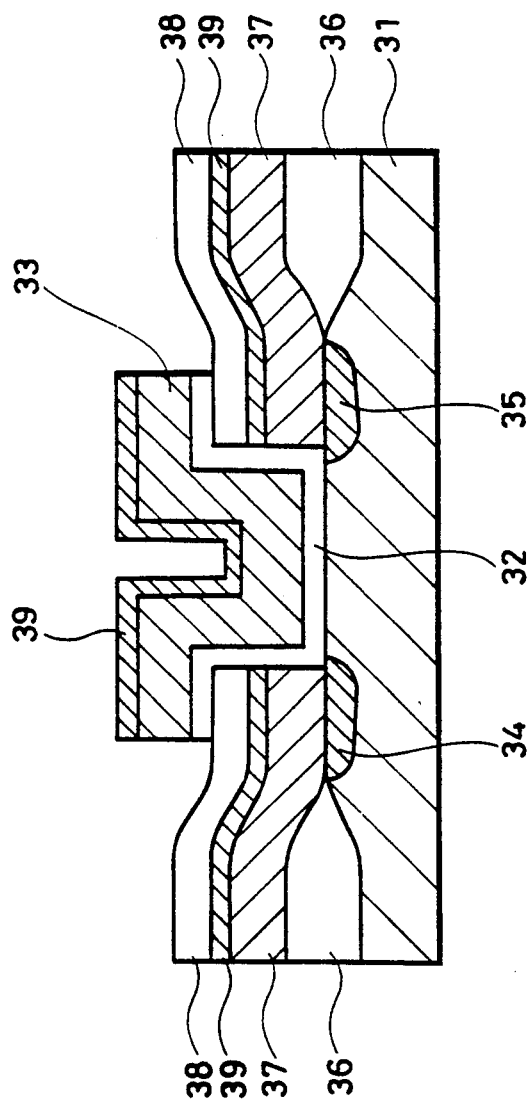
FIG. 9 is a sectional view of a conventional PSD field effect transistor having a metal silicide layer formed on an electric conductor layer.
Figure 10A:
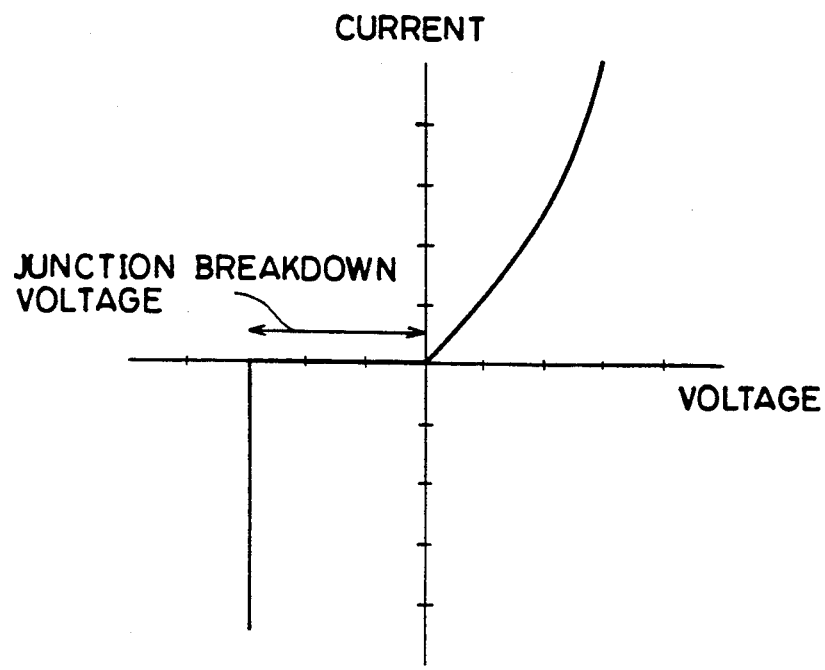
FIG. 10A is a graph showing the relation between the current and the voltage in a device having no crystal defect at the pn junction.
Figure 10B:
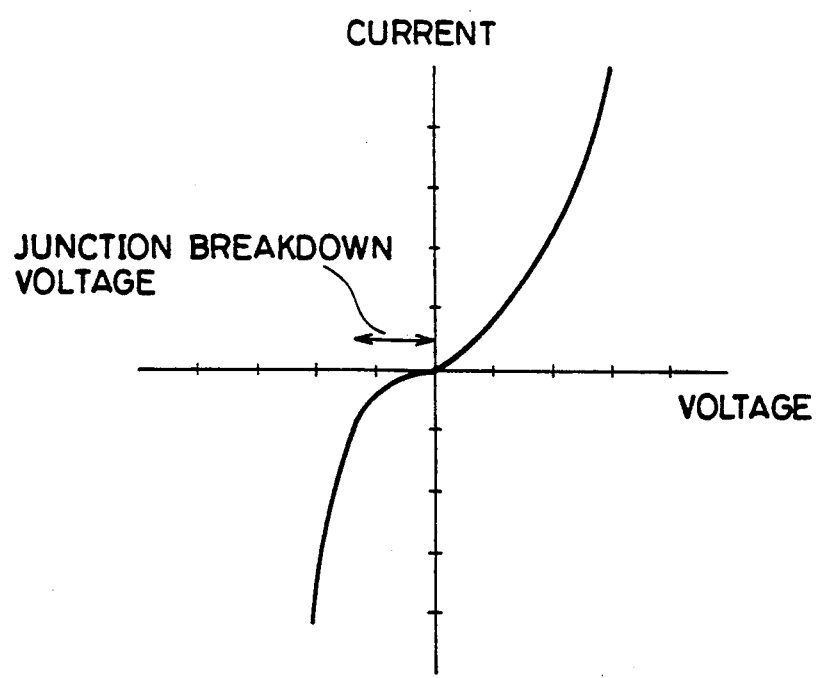
FIG. 10B is a graph showing the relation between the current and the voltage in a device having crystal defects at the pn junction.

Thereafter, using reactive ion etching, the fourth silicon oxide film 66 is removed so that there remain only the fourth silicon oxide film portion in contact with the side faces of the gate electrode 52. This remaining fourth silicon oxide film 66 will hereinafter be referred to as a side-wall spacer 67 (FIG. 5B).

The steps from FIGS. 5C to 5G are the same as the steps of FIGS. 4A to 4E in the previous embodiment, so will not be explained here.

The PSD transistor manufacturing process of this embodiment is completed by the above steps.

An effect peculiar to this embodiment is that since the side-wall spacer 67 is formed on each side face portion of the gate electrode 52, the possibility of the titanium silicide 62 on the first polycrystalline silicon film 43 growing along the side faces of the gate electrode 52 and making connection between the first polycrystalline silicon film 43 and the gate electrode 52 is lower than that in the previous embodiment.

In the field effect transistor producing method of the present invention, since the side-wall insulating film and the gate insulating film are formed by separate steps, both can be formed each in optimum thickness.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for producing a field effect transistor which is provided with a gate electrode, a source electrode and a drain electrode on a major surface of a semiconductor substrate and wherein a source area and a drain area are formed by diffusing an impurity contained in said source electrode and aid drain electrode into said semiconductor substrate by heat treatment, said method including the steps of:

forming a first electric conductor layer to serve as said source electrode and said drain electrode on the major surface of said semiconductor substrate;

forming a first insulating film on said first electric conductor layer;

removing said first insulating film and first electric conductor layer selectively by etching to expose the major surface portion of said semiconductor substrate located in the position corresponding to a channel-forming area of the field effect transistor;

forming a second insulating film on the thus-exposed major surface portion of the semiconductor substrate and also on said first insulating film;

etching said second insulating film so that a side-wall insulating film remains on the side faces of said first electric conductor layer and the side faces of said first insulating film;

forming a gate insulating film on the major surface portion of said semiconductor substrate positioned on said channel-forming area;

forming a second electric conductor layer on all of said gate insulating film, said side-wall insulating film and said second insulating film; and forming a gate electrode of a predetermined shape by patterning the second electric conductor layer.

2. A method according to claim 1, further including the step of ion-implanting an impurity for forming said source area and said drain area into said first electric conductor layer after the formation of said first electric conductor layer.

3. A method according to claim 1, further including the step of ion-implanting an impurity for forming said source area and said drain area into said first electric conductor layer.

4. A method according to claim 1, wherein said first electric conductor layer formed on the major surface of said semiconductor substrate is doped using an impurity for forming said source area and said drain area.

5. A method according to claim 1, further including, between the step of forming said side-wall insulating film and the step of forming said gate insulating film, the steps of:

forming a thin oxide film by thermal oxidation on the major surface portion of said semiconductor substrate positioned on said channel-forming area; and removing said thin oxide film using an acidic solution.

6. A method according to claim 1, wherein the portion of said side-wall insulating film positioned at an upper corner portion of said source electrode and the portion thereof positioned at an upper corner portion of said drain electrode have a thickness twice or more the thickness of said gate insulating film.

7. A method according to claim 1, wherein said first electric conductor layer is a polycrystalline silicon layer.

8. A method according to claim 1, wherein said first electric conductor layer is an amorphous silicon layer.

9. A method according to claim 1, wherein said second insulating film is a silicon oxide film.

10. A method according to claim 1, wherein said gate electrode, said source electrode and said drain electrode are formed by a polycrystalline silicon or an amorphous silicon.

11. A method according to claim 10, further including the steps of;
forming a metallic film by deposition on all of the surfaces of said gate electrode, said source electrode and said drain electrode; and
heat-treating said metallic film to form a silicide layer on all of the surfaces of said gate electrode, said source electrode and said drain electrode.

12. A method according to claim 11, wherein the constituent element of said metallic film is a metal selected from the group consisting of titanium, tungsten, molybdenum and cobalt.

13. A method according to claim 10, further including the steps of:
forming a metallic film by deposition on all of the surface of said gate electrode, said source electrode and said drain electrode after the formation of said gate electrode;
heat-treating said metallic film, thereby allowing part of said metallic film and the polycrystalline silicon or the amorphous silicon positioned thereunder to react with each other to form a silicide layer on all of the surfaces of said gate electrode, said source electrode and said drain electrode; and
removing unreacted said metallic film using an acidic solution 14. A method according to claim 13, further including the step of stabilizing said silicide layer by heat treatment.

15. A method of forming a PSD-type field effect transistor on a horizontal major surface of a silicon substrate, comprising the steps of:
forming source and drain electrodes spaced apart form each other on the major surface of said substrate to define a channel region therebetween in said substrate;
forming an insulating layer on said source and drain electrodes;
forming a gate insulating film on said channel region of said substrate;
forming a first side-wall insulating film on said pair of source and drain electrodes, first and second surfaces of said side-wall insulating film respectively contacting said source and drain electrodes and said major surface of the substrate, a remaining surface of said side-wall insulating film being arcuate;
forming an insulating layer on said source and drain electrodes extending outwardly from said first side-wall insulating film;
forming a gate electrode on said gate insulating film on the channel region of said substrate and on said first side-wall insulating film and said insulating layer, said gate electrode having a T-shaped cross-section with opposing upper arms extending over said source and drain electrodes and vertically separated therefrom by said insulating layer, outer side surfaces of said arms lying in a common vertical plane with respective outer side surfaces of said insulating layer; and
forming a first high conductivity layer including a metal on a portion of said source and drain electrodes extending outwardly from said common vertical plane.

16. The method of claim 15 further comprising a step of diffusing impurities from said source and drain electrodes into said substrate to respectively form source and drain impurity regions in said substrate on opposite sides of said channel region.

17. The method of claim 16 wherein said diffusion step includes a step of thermal treatment of said substrate.

18. The method of claim 15, further comprising a step of forming a second high conductivity layer overlying upper and side surfaces of said gate electrode, wherein said first high conductivity layer is in vertical alignment with said second high conductivity layer and said insulation layer.

19. The method of claim 18, wherein said step of forming said second high conductivity layer includes a step of depositing a metal silicide.

20. The method of claim 19, wherein said step of depositing a metal silicide includes a step of depositing a metal selected from a group of metals consisting of tungsten, molybdenum, cobalt, nickel, platinum, tantalum, zirconium and palladium.

21. The method of claim 15, wherein said step of forming said second high conductivity layer includes a step of depositing a metal silicide.

22. The method of claim 21, wherein said step of depositing a metal silicide includes a step of depositing a metal selected from a group of metals consisting of tungsten, molybdenum, cobalt, nickel, platinum, tantalum, zirconium and palladium.

23. A method of forming a PSD-type field effect transistor on a silicon substrate having a horizontal major surface, comprising the steps of:
forming source and drain electrodes spaced apart on the major surface of said substrate defining a channel region therebetween in the major surface of said substrate;
forming a gate insulating film formed on the surface of said substrate over said channel region;
forming a first side-wall insulating film on said source and drain electrodes, first and second surfaces of said side-wall insulating film respectively contacting said pair of source and drain electrodes and said major surface of the substrate, a remaining surface of said side-wall insulating film being arcuate;
forming an insulation layer on said source and drain electrodes extending outwardly from said first side-wall insulating film and onto upper surfaces of said source and drain electrodes;
forming a gate electrode on said gate insulating film above the channel region of said substrate, said gate electrode having a T-shaped cross-section with opposing upper arms extending onto said insulation layer over said source and drain electrodes, an outer side surface of said gate electrode lying in a common vertical plane with an outer side surface of said insulation layer;

forming source and drain impurity regions in said major surface of said substrate on opposite sides of said channel region and immediately under, and in contact with, said source and drain electrodes, respectively; and forming a second sidewall insulating film on the outer side surfaces of said gate electrode and said insulation layer.

24. The method of claim 23 wherein said step of forming source and drain impurity regions includes a step of thermal treatment of said substrate.

25. The method of claim 23 wherein said step of forming source and drain impurity regions includes a step of diffusing impurities form said source and drain electrodes into respective underlying portions of said substrate.

26. The method of claim 23 further comprising a step of forming a first high conductivity layer including a metal no a portion of said source and drain electrodes extending outwardly from said common vertical plane.

27. The method of claim 26, further comprising a step of forming a second high conductivity layer including a metal on an upper surface of said gate electrode, said second high conductivity layer having sidewalls in vertical alignment with opposite surfaces of said second sidewall insulating film.

28. The method of claim 23, wherein said step of forming said first high conductivity layer includes a step of depositing a metal silicide.

29. The method of claim 28, wherein said step of depositing said metal silicide includes a step of depositing a metal selected rom a group consisting of tungsten, molybdenum, cobalt, nickel, platinum, tantalum, zirconium and palladium.

30. The method of claim 27, wherein said step of forming said first high conductivity layer includes a step of depositing a metal silicide.

31. The method of claim 30, wherein said step of depositing said metal silicide includes a step of depositing a metal selected from a group consisting of tungsten, molybdenum, cobalt, nickel, platinum, tantalum, zirconium and palladium.

* * * * *